(12) United States Patent
Choe et al.

(10) Patent No.: US 7,046,566 B1
(45) Date of Patent: May 16, 2006

(54) VOLTAGE-BASED TIMING CONTROL OF MEMORY BIT LINES

(75) Inventors: Kok Heng Choe, Penang (MY); Edwin Yew Fatt Kok, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/005,996

(22) Filed: Dec. 6, 2004

(51) Int. Cl.
*G11C 7/00* (2006.01)

(52) U.S. Cl. ............ 365/203; 365/189.07; 365/189.11; 365/204

(58) Field of Classification Search ............ None
See application file for complete search history.

(56) References Cited

U.S. PATENT DOCUMENTS

| | | | |
|---|---|---|---|
| 4,807,193 A | | 2/1989 | Takemae et al. |
| 5,001,668 A | * | 3/1991 | Ito et al. ................ 365/185.25 |
| 5,268,871 A | * | 12/1993 | Dhong et al. ............... 365/226 |
| 6,704,218 B1 | * | 3/2004 | Rickes et al. ............... 365/145 |
| 6,762,970 B1 | * | 7/2004 | Joo ....................... 365/230.06 |
| 6,842,388 B1 | * | 1/2005 | Origasa et al. ............. 365/203 |

\* cited by examiner

*Primary Examiner*—Tan T. Nguyen
(74) *Attorney, Agent, or Firm*—Fish & Neave IP Group Ropes & Gray LLP; Robert R. Jackson; Chia-Hao La

(57) ABSTRACT

Circuitry and methods are provided for controlling memory operation by comparing bit line voltages to preset reference voltages. By relying on bit line voltage levels to determine when to start and end each stage of a read or write operation, reliance on precisely tuned delay chains is removed. Parasitic effects are automatically accounted for, as well as process, voltage, and temperature variations. This precise matching of operation timing to memory bit line conditions results in improved system performance.

20 Claims, 4 Drawing Sheets

VOLTAGE-BASED TIMING CONTROL OF MEMORY BIT LINES

BACKGROUND OF THE INVENTION

The control of memory bit lines, which are used to transfer data into and out of memory cells, is subject to precise timing constraints. For instance, a typical memory read operation includes driving bit lines by connecting them to the corresponding memory cells, amplifying the bit line voltages (e.g., with a sense amplifier), and precharging the bit lines in preparation for subsequent operations. Each of these stages must be triggered in sequence. If a particular stage is initiated too soon (e.g., the precharge stage is commenced before sense amplification has completed), data could be corrupted.

A typical memory write operation has similar constraints. The operation often includes writing new data to bit lines using write drivers, connecting the bit lines to the corresponding memory cells, and precharging the bit lines in preparation for subsequent operations. As with read operations, the stages of a memory write must be triggered in the correct sequence. Beginning one stage before the previous stage has completed may result in data corruption and reduction of overall system integrity.

Delay chains are often used to enforce the timing sequences described above. These chains are usually tuned to a representative group of bit lines, and are designed to introduce appropriate amounts of delay for that group. Unfortunately, timing conditions often vary across different areas of a chip, due to process, voltage, and temperature ("PVT") variation. In addition, parasitic and process effects such as coupling, length of diffusion ("LOD") stress, and lateral diffusion make reliable timing control even more difficult.

In order to account for variations such as those listed above, bit line memory delays are often allocated liberally. That is, designers will often choose one set of delays that will work for all bit lines and apply them across the entire memory. Although this approach is relatively simple and robust, it leads to excessive delay in many areas of a chip. Since memory bit lines are accessed and driven by a variety of different circuits, and since they are often used on a recurring basis, these inefficiencies can lead to a significant performance loss.

In view of the foregoing, it would be desirable to provide circuitry and methods that vary the delay of each stage of a memory bit line operation across different areas of a chip. In addition, it would be desirable to vary this delay in a way that optimizes the speed of each operation, without the use of careful hand tuning to compensate for PVT or parasitic effects.

SUMMARY OF THE INVENTION

In accordance with this invention, circuitry and methods are provided to control bit line operations by comparing the voltage across a digit line pair to reference voltage thresholds. An embodiment of the invention includes a multiplexer to select an appropriate reference voltage and comparator circuitry to compare the selected reference voltage to the measured bit line voltage. The embodiment also includes logic that controls the multiplexer and uses the output of the comparator to control bit line access. Although the invention is described in the context of using two bit lines for each memory cell, it will be understood that the invention can also be applied to memories that use a single bit line to access each cell.

During a read operation, the voltage across each bit line pair involved in the operation is examined. That voltage is used to enable the sense amplifier, disable the sense amplifier and enable the precharge circuit, and disable the precharge circuit. Each step is triggered when the detected voltage reaches a predetermined threshold voltage corresponding to the current stage of the operation.

Similarly, during a write operation, the voltage across each relevant bit line pair is used to activate stages of the operation. For example, this voltage is used to enable the write drivers, disable the write drivers and enable the precharge circuit, and disable the precharge circuit. As with the read operation, a different threshold voltage is used to trigger each stage of the operation.

Use of the invention effectively transfers control of bit line operations from the time domain to the voltage domain. This automatically accounts for PVT and parasitic effects that can vary how long it takes different bit line pairs to reach certain voltage levels. Furthermore, since the voltage thresholds can be chosen to reflect the functional specifications of individual circuits, each stage of an operation can begin and end at with voltage levels appropriate to the circuit driving or accessing the bit lines.

The invention therefore advantageously uses reference voltage thresholds to control memory bit line operations. The reliance on voltage measurements instead of timing measurements permits improved performance while maintaining, if not improving, memory robustness. Furthermore, the invention does not require much circuitry to implement, and in most cases can replace area-intensive delay chains used to control operation timing, thereby improving efficiency with little or no loss in area.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
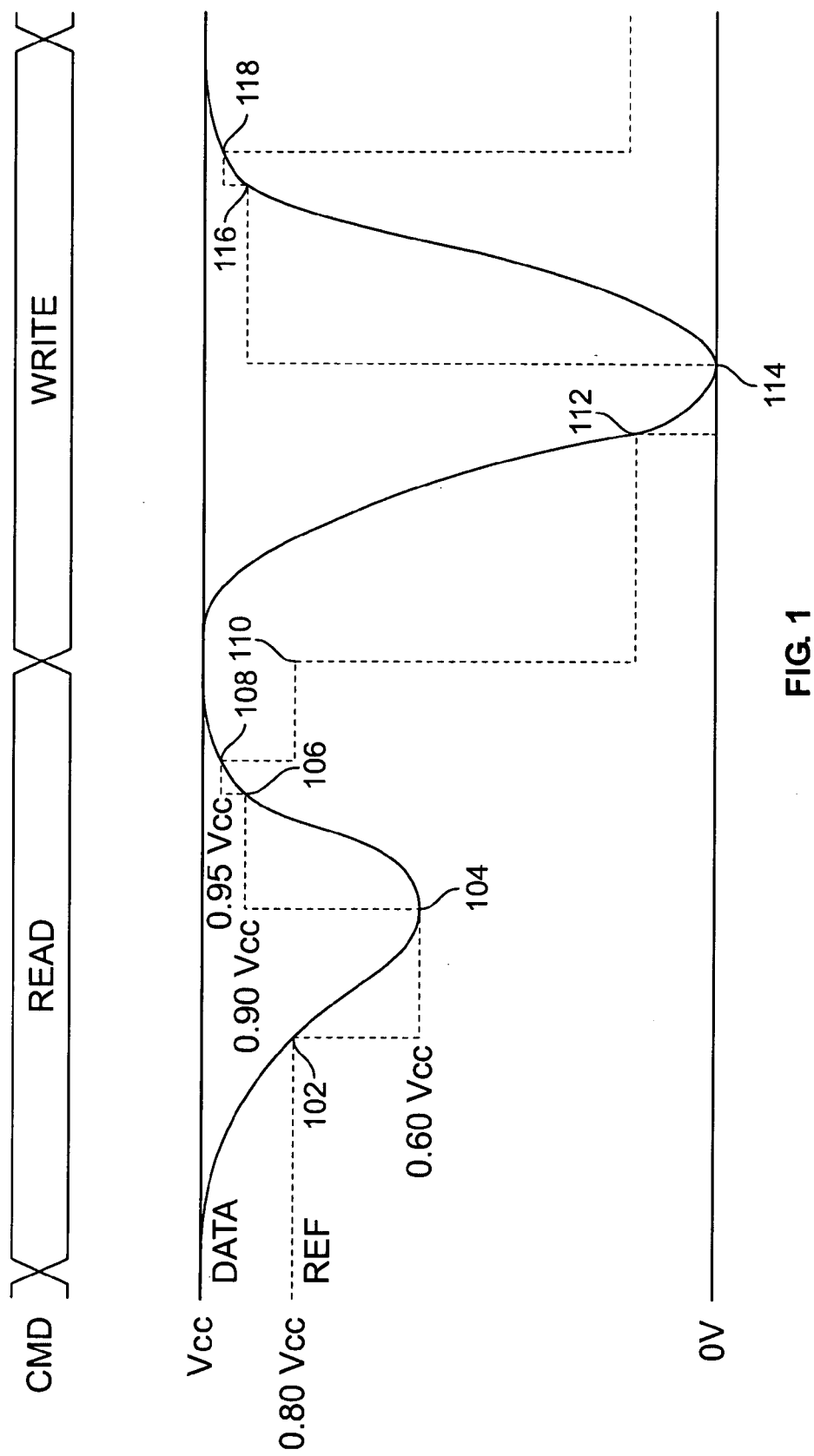
FIG. 1 is a timing diagram showing illustrative waveforms in accordance with the invention.

FIG. 1 is a timing diagram showing illustrative waveforms in accordance with the invention. Signal CMD encodes the operation being performed on the memory, if any. Signal DATA represents the voltage on a memory bit line, and signal REF represents a reference threshold voltage used for bit line control. In order to facilitate understanding of the invention, a brief description of exemplary memory operations is provided below.

Many memory systems use a pair of bit lines to transfer data to and from each cell. The bit lines in a given pair are referred to herein as DATA and NDATA. Before a read or write operation commences, both bit lines are precharged to a predetermined value by a precharge circuit. The embodiment described herein uses a precharge voltage of Vcc, though any suitable value, such as Vcc/2 or 0V, could be used.

During a read operation, both bit lines are connected to the corresponding cell. Depending on the logical value stored in the cell, either DATA will be connected to a relatively low voltage and NDATA will be connected to a voltage substantially equal to Vcc, or vice versa. Suppose DATA is connected to a relatively low voltage. Thereafter, both DATA and NDATA are driven by a sense amplifier, so that the relatively high voltage will be forced to about Vcc and the relatively low voltage will be forced even lower. When amplification is complete, the bit line pair is examined to determine the value of the memory cell's data, and the bit line pair is precharged in preparation for the next operation.

During a write operation, the precharged bit line pair is driven by write drivers. Depending on the logical value to be written, either DATA is driven to about 0V and NDATA is driven to about Vcc, or vice versa. Thereafter, the bit line pair is connected to the corresponding memory cell, driving the cell's voltages to appropriate levels. Finally, the bit line pair is precharged in preparation for subsequent operations.

As shown in FIG. 1, signal DATA is pulled to a relatively low voltage twice, first in a read operation and then in a write operation. The solid waveform represents DATA, while the dotted waveform represents variable threshold REF. The read operation begins with signal DATA already precharged to Vcc, and signal REF set to a value lower than Vcc (e.g., 0.80*Vcc). This lower value corresponds to a voltage difference across the bit line pair that is sufficient for sense amplification to occur. The bit line pair is connected to the corresponding memory cell as described above, and signal DATA is pulled to a lower voltage level by the (assumed) contents of the memory cell. At time 102, voltage DATA drops below voltage REF, activating the sense amplifier and shifting REF to the next voltage level (e.g., 0.60*Vcc).

At time 104, DATA again dips below threshold REF, and sense amplification is disabled. At this point, the bit line voltages can be transmitted to external circuitry (e.g., a memory controller), thereby outputting the contents of the memory cell being read. Substantially simultaneously, the precharge circuit is activated and voltage REF is set to the next voltage threshold (e.g., 0.90*Vcc). The precharge circuit drives the voltage of DATA upwards until it crosses the value of REF (e.g., 0.90*Vcc) at time 106.

In one embodiment of the invention, the precharge circuit includes a strong portion and a weak portion, which together permit a gradual termination of the precharge stage. Accordingly, at time 106 the strong portion of the precharge circuit is disabled and REF is set to a slightly higher value (e.g., 0.95*Vcc). When the DATA voltage crosses this higher value at time 108, the weak portion of the precharge circuit is disabled. At this time, the read operation is finished and REF is reset to the value it had at the beginning of the operation (e.g., 0.80*Vcc).

Note that, as shown in FIG. 1, the voltage of DATA may continue to rise after time 108. For instance, a timer circuit may be configured to disable the weak portion of the precharge circuit a certain amount of time (e.g., 10 picoseconds) after time 108. This delay causes the voltage of DATA to rise to about Vcc near the end of the READ operation.

The write operation proceeds similarly, using voltage REF to control when each stage begins and ends. At time 110, the write operation commences and voltage REF is set to an appropriate value. A write driver pulls the voltage of DATA down past that value, and at time 112 the driver is disabled. As with the precharge circuit, the disabling of the write driver may be delayed by a timer circuit. Accordingly, the voltage of DATA may continue to decrease after time 112, as shown in FIG. 1. In one embodiment, the timer circuit is configured so that the voltage of DATA is guaranteed to reach a certain voltage threshold (e.g, 0V). As shown, this threshold is crossed at time 114.

At this point, the bit line pair can be connected to the corresponding memory cell to write the (assumed) data into that cell. Substantially simultaneously, REF is shifted to its next value and the precharge circuit is activated. At time 116, DATA reaches a sufficiently high voltage, the strong portion of the precharge circuit is disabled, and REF is set to a slightly higher voltage. This higher voltage is reached at time 118, when the weak precharge circuit is disabled. At time 118, REF is reset to the value it had at the start of the write operation. As with the read operation, a timer circuit may be configured to disable the weak portion of the precharge circuit a certain amount of time (e.g., 10 picoseconds) after time 118. This delay causes the voltage of DATA to rise to about VCC near the end of the write operation.

It will be understood that the voltage levels, operation stages, and the ordering of these stages in FIG. 1 are merely illustrative. For instance, some memory systems may precharge both bit lines to about Vcc/2, and connect only one of those lines to a memory cell, pulling the voltage of that line higher or lower than Vcc/2. Also, some memory systems precharge at the start of each operation instead of at the end. Other systems may have more or fewer stages in each operation. For instance, a dynamic random access memory ("DRAM") may perform a refresh operation with each read operation.

Figure 2:
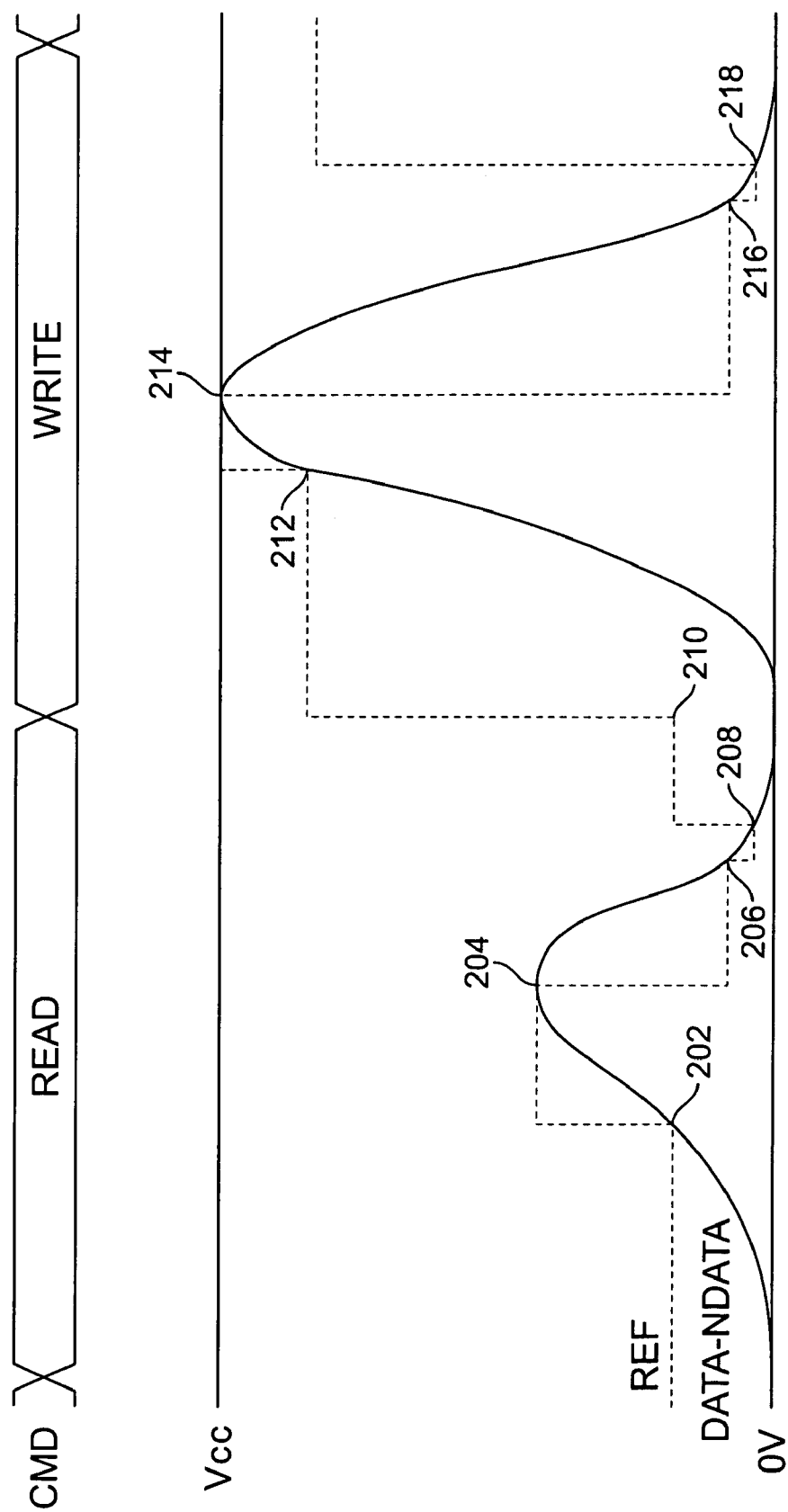
FIG. 2 is a timing diagram showing additional illustrative waveforms in accordance with the invention.

In addition, the invention need not be applied to the voltage of a single bit line. It can also be used to compare the voltage across a bit line pair to predetermined threshold voltages. FIG. 2 illustrates such a usage. As with FIG. 1, CMD represents a signal encoding the operation to be performed and REF represents a reference voltage threshold corresponding to each stage of an operation. However, instead of comparing REF to DATA, REF is compared to the quantity DATA-NDATA.

Since the voltage on DATA and NDATA are substantially equal at the start of an operation, DATA-NDATA is approximately 0V at the beginning of the read operation. The operation then proceeds through steps analogous to those of FIG. 1. The sense amplifier is activated at time 202 and deactivated at time 204. The precharge circuit is activated at time 204 and its strong and weak portions are deactivated at times 206 and 208, respectively. The deactivation of the weak portion may be delayed past time 208. At each of these times, when DATA-NDATA reaches voltage REF, signal REF is set to the next value in the sequence.

Likewise, the write operation proceeds through steps analogous to those of FIG. 1, beginning at time 210. The write driver is activated at time 210 and deactivated at time 212, where the deactivation may be subject to a preset delay. The precharge circuit is activated at time 214 and its strong and weak portions are deactivated at times 216 and 218, respectively. The deactivation of the weak portion may be delayed past time 218. At each of these times, when DATA-NDATA reaches voltage REF, signal REF is set to the next value in the sequence.

Figure 3:
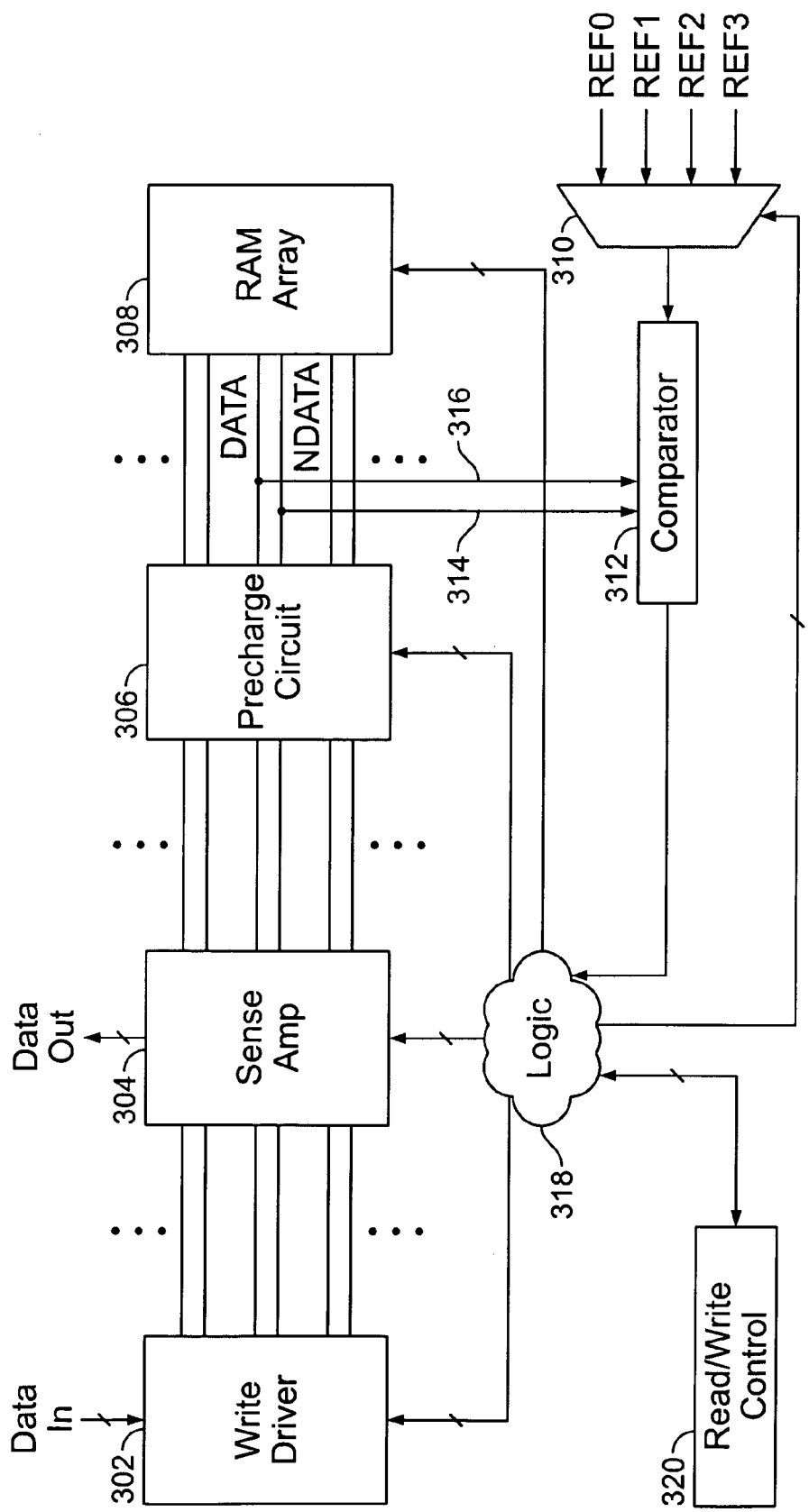
FIG. 3 is a diagram showing illustrative circuitry in accordance with the invention.

FIG. 3 is a diagram showing illustrative circuitry in accordance with the invention. Write driver 302 receives incoming data during a write operation and drives appropriate voltages onto the targeted bit lines. Sense amplifier 304 amplifies the voltage difference on pairs of bit lines during a read operation and sends the amplified voltages out as data. Precharge circuit 306 precharges bit lines at the end of each operation as shown in FIGS. 1 and 2. Random access memory ("RAM") array 308 is an array of memory cells that store the logical data. The RAM can be a DRAM, configurable RAM ("CRAM"), erasable RAM ("ERAM"), or any other suitable type of memory supporting read and write operations.

Multiplexer 310 selects an appropriate reference voltage corresponding to the stage of the operation being performed at any given time. Although four voltage references are illustrated, any suitable number can be used. The selected reference voltage is compared to a bit line voltage from bit lines 314 and 316 by comparator 312. Comparator 312 can be any suitable comparator, such as a differential comparator or two smaller comparators coupled with logic. The result of the comparison is communicated to logic 318, which uses the information to control write driver 302, sense amplifier 304, precharge circuit 306, and RAM array 308. Logic 318 also controls multiplexer 310, switching the reference voltage as appropriate. In addition, logic 318 communicates with read/write control circuitry 320, which processes read and write requests from external circuitry, such as a memory controller.

By relying on reference voltages to control memory bit line operations, the timing of those operations can be easily matched to the conditions of a particular bit line pair. In contrast, the use of delay chains requires the use of liberal catch-all delay estimates that match certain bit lines well but allocate excess time for others. Also, the precise tuning of individual delay chains or sets of delay chains is labor-intensive and impractical. Thus, the invention allows one to combine the performance gains of customized bit line timing with the ease of applying one approach to all lines in a memory.

The reference voltages used as thresholds can be chosen to match circuit specifications, so that each stage of a read or write operation is guaranteed to operate within a permissible voltage range. In addition, the area saved by removing delay chains can be used to add the logic, comparators, and multiplexers of the invention. Thus, no significant additional area is needed, if any.

Note that the embodiments shown and described herein are merely illustrative. For instance, as described above, the invention can be applied to many different schemes for precharging, amplifying, and driving the voltages on the memory bit lines. Although the invention has been described in the context of RAM read and write operations, the invention can also be applied to refresh operations or any other types of circuits or operations requiring precise timing control of voltage-sensitive circuits.

Figure 4:
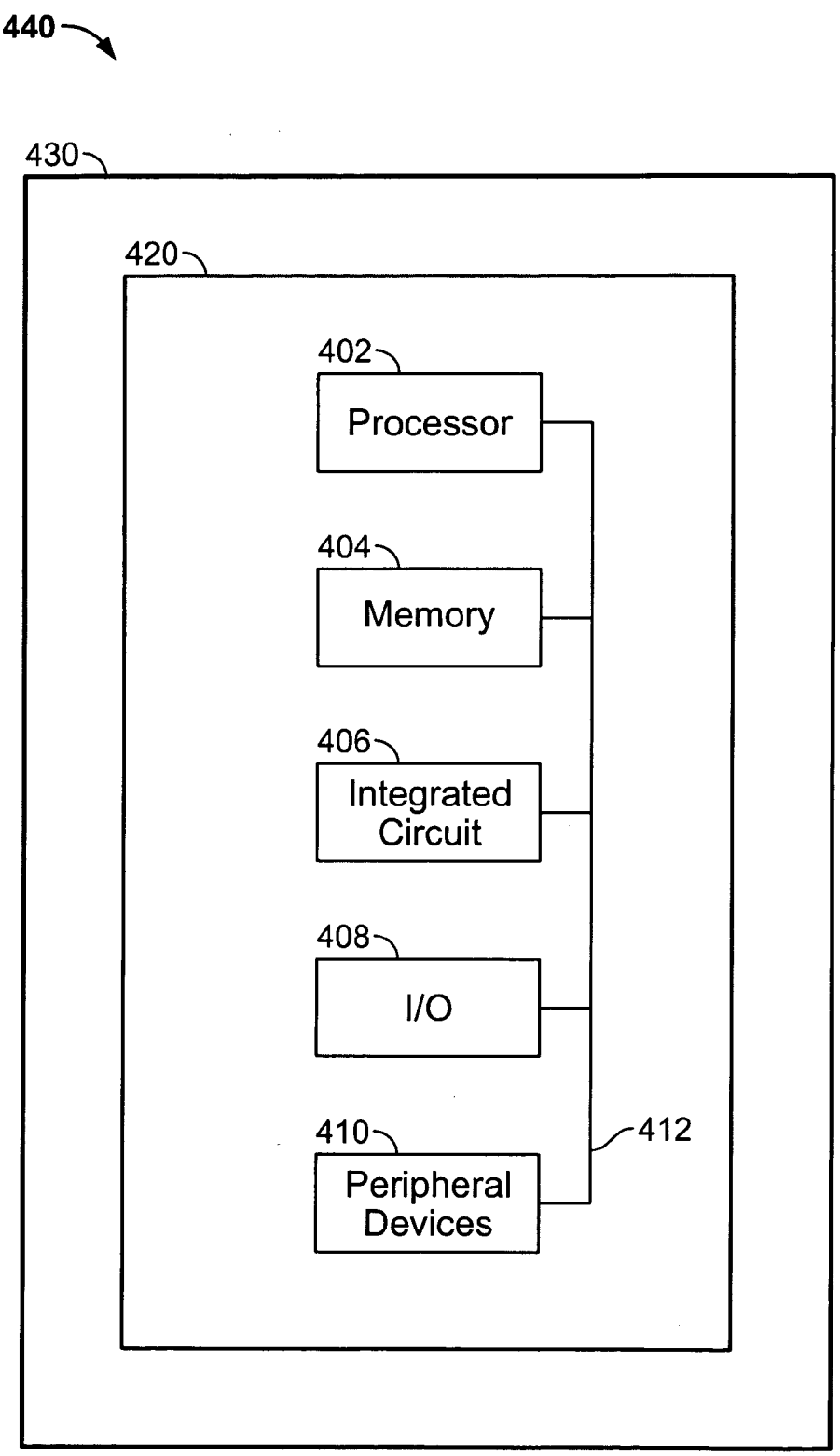
FIG. 4 is a diagram showing a system that incorporates the invention.

FIG. 4 illustrates a memory 404, which incorporates the voltage-based timing control of this invention, in a data processing system 440. Data processing system 440 may include one or more of the following components: processor 402; integrated circuit ("IC") 406; I/O circuitry 408; and peripheral devices 410. These components are coupled together by a system bus 412 and are populated on a circuit board 420 which is contained in an end-user system 430.

As another example, the memory circuitry of this invention may be part of the circuitry of IC 406. Other circuitry of IC 406 may be programmable logic circuitry. IC 406 may therefore be a programmable logic device with memory circuitry in accordance with this invention.

System 440 can be used in a wide variety of applications, such as computer networking, data networking, instrumentation, video processing, or digital signal processing. IC 406 can be used to perform a variety of different logic functions. For example, IC 406 can be configured as a processor or controller that works in cooperation with processor 402. IC 406 may also be used as an arbiter for arbitrating access to a shared resource in system 440. In yet another example, IC 406 can be configured as an interface between processor 402 and one of the other components in system 440.

Thus it is seen that circuits and methods are provided for using reference voltages for timing control of memory bit lines. One skilled in the art will appreciate that the invention can be practiced by other than the described embodiments, which are presented for purposes of illustration and not of limitation, and the present invention is limited only by the claims which follow.

We claim:

1. A method of controlling at least one line of a memory, said method comprising:
   detecting a voltage of said at least one memory line;
   comparing said detected voltage to a reference voltage; and
   driving said at least one memory line to a voltage level based on a result of said comparing.

2. The method of claim 1 further comprising selecting said reference voltage from among a plurality of reference voltages.

3. The method of claim 1 wherein said driving comprises precharging said at least one memory line.

4. The method of claim 1 further comprising receiving a control signal.

5. The method of claim 4 wherein said control signal comprises a memory read command signal.

6. The method of claim 5 wherein said driving comprises activating sense amplification circuitry.

7. The method of claim 4 wherein said control signal comprises a memory write command signal.

8. The method of claim 7 wherein said voltage level is indicative of a logical value to be written to said memory.

9. Circuitry for controlling at least one line of a memory, said circuitry comprising:
   comparator circuitry for comparing a detected voltage of said at least one memory line to a voltage reference;
   driver circuitry for driving said at least one memory line to at least one voltage level; and
   logic operative to receive an input signal from said comparator circuitry and to generate an output signal to control said driver circuitry.

10. The circuitry of claim 9 further comprising a multiplexer for selecting said voltage reference from among a plurality of voltage references.

11. The circuitry of claim 10 wherein said multiplexer is controlled by said logic.

12. The circuitry of claim 9 further comprising read/write command circuitry coupled to said logic.

13. The circuitry of claim 9 wherein said driver circuitry comprises:
   write driver circuitry;
   sense amplification circuitry; and
   precharge circuitry.

14. A memory comprising the circuitry of claim 9.

15. A data processing system comprising:
   the memory of claim 14;
   a processor coupled to said memory; and
   input/output devices coupled to said processor.

16. A method for controlling at least one line of a memory, said method comprising:
   examining said at least one memory line to determine a first voltage;

comparing said first voltage to a first threshold;
driving said at least one memory line in order to obtain a second voltage different from said first voltage; and
selecting a second threshold.

17. The method of claim 16, further comprising comparing said second voltage to said second threshold.

18. The method of claim 16 wherein said examining comprises measuring the voltage on said at least one memory line.

19. The method of claim 16 wherein:
said at least one memory line comprises two memory lines; and
said examining comprises measuring a voltage difference between said two memory lines.

20. The method of claim 19 wherein said at least one memory line is operative to transfer data to and from a cell of said memory.

* * * * *